United States Patent
Shyr et al.

(10) Patent No.: US 6,239,987 B1
(45) Date of Patent: May 29, 2001

(54) CASE FOR SEMICONDUCTOR CIRCUIT OF A SURGE PROTECTOR

(75) Inventors: Richard Sheng-Tong Shyr, Taichung (TW); Enrico F. Napoletano, Flushing; Marie Guillot, St. James, both of NY (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 08/218,802

(22) Filed: Mar. 28, 1994

Related U.S. Application Data

(63) Continuation-in-part of application No. 08/148,875, filed on Nov. 8, 1993, now abandoned.

(51) Int. Cl.[7] .................................................... H02H 1/04
(52) U.S. Cl. ..................... 361/820; 257/724; 361/118; 361/747
(58) Field of Search ................................. 174/52.1, 52.2, 174/52.5; 257/678, 688, 690, 723, 724, 729, 777, 787; 361/111, 118, 119, 600, 679, 728, 730, 747, 820

(56) References Cited

U.S. PATENT DOCUMENTS

| 4,218,694 | 8/1980 | Grzybowski | 357/76 |
|---|---|---|---|
| 4,408,248 | 10/1983 | Bulley et al. | 361/91 |
| 4,599,636 | 7/1986 | Roberts et al. | 357/76 |
| 4,796,150 | 1/1989 | Dickey et al. | 361/119 |
| 5,034,803 | * 7/1991 | Crowe | 357/76 |
| 5,155,649 | * 10/1992 | Hung | 361/119 |
| 5,175,662 | * 12/1992 | DeBalko | 361/119 |
| 5,227,456 | * 7/1993 | Shepherd | 528/173 |
| 5,272,587 | * 12/1993 | Wan | 361/111 |
| 5,369,543 | * 11/1994 | Bonnesen | 361/117 |

* cited by examiner

*Primary Examiner*—Gerald Tolin
(74) *Attorney, Agent, or Firm*—Mayer, Fortkort & Williams

(57) ABSTRACT

First and second thermoplastic case parts house a surge protector semiconductor subassembly having a plurality of components. The first and second thermoplastic case parts are substantially identical, and each case part has a semiconductor subassembly receiving recess therein. The first and second thermoplastic case parts have corresponding projections and recesses so that the first and second thermoplastic case parts may be snapped together to form a hollow case encapsulating the semiconductor subassembly. The hollow case includes spring means integral with the hollow case for applying force on the semiconductor subassembly to retain the components of the semiconductor subassembly together in the event that the case is subjected to high temperature due to a high current surge.

13 Claims, 5 Drawing Sheets

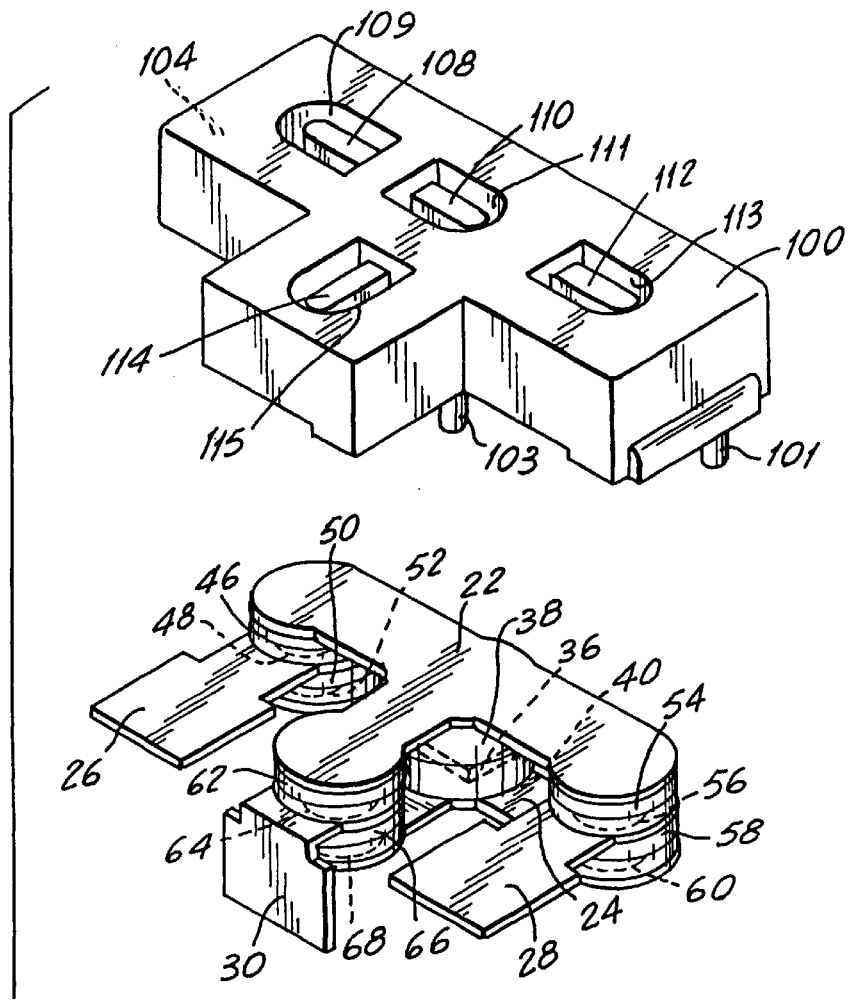
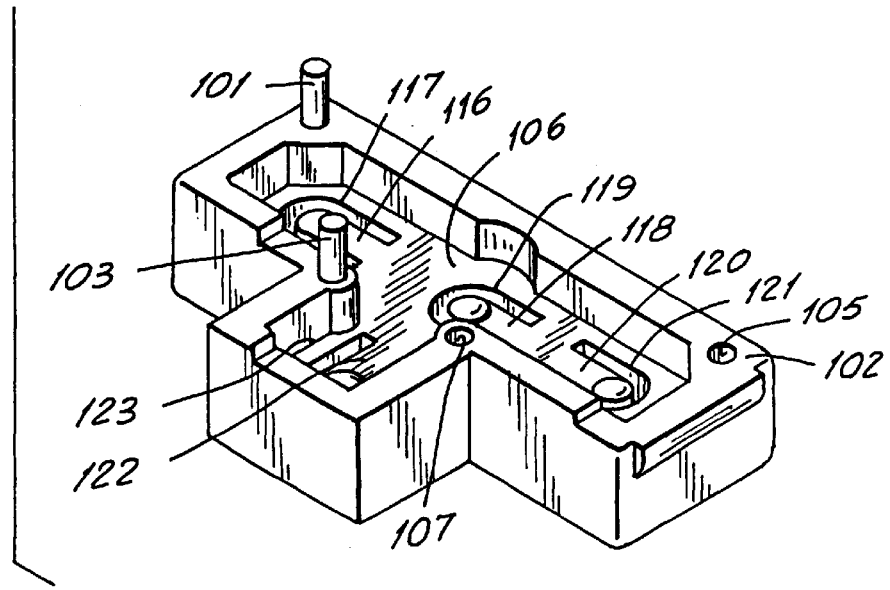
FIG. 2

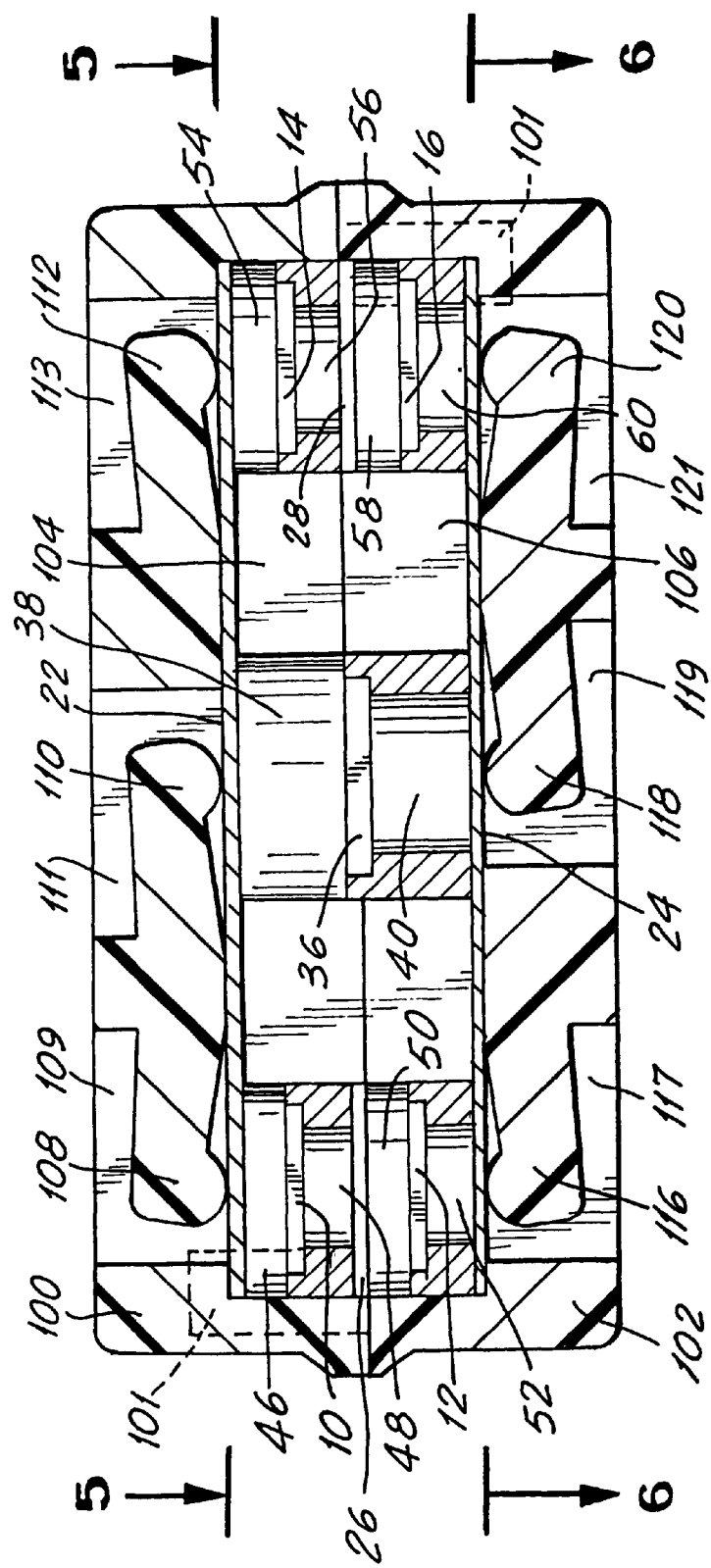

CASE FOR SEMICONDUCTOR CIRCUIT OF A SURGE PROTECTOR

RELATED APPLICATION

The present application is a continuation-in-part of U.S. patent application Ser. No. 08/148,875 filed on Nov. 8, 1993 now abandoned.

TECHNICAL FIELD OF THE INVENTION

The present invention relates to a surge protector for protecting telecommunication equipment, and the users of such telecommunication equipment, from power surges, and to a hollow two part snap together thermoplastic case for encapsulating the components of a semiconductor subassembly. These components are retained together by the case in the event that the case melts so that the semiconductor subassembly is prevented from failing in an open state. The present invention also relates to a simplified method for encapsulating a semiconductor subassembly.

BACKGROUND OF THE INVENTION

U.S. Pat. No. 4,796,150 issued Jan. 3, 1989 to Dickey, et al. discloses a mechanical-electrical device for protecting telecommunication equipment from power surges which may occur on tip and/or ring conductors of the transmission lines to which the telecommunication equipment is connected. The device disclosed by Dickey, and similar devices of this type, employ a solid state surge protection circuit, one example of which is disclosed in detail in U.S. Pat. No. 4,408,248 issued Oct. 4, 1983 to Bulley et al.

The Bulley circuit provides protection against surges in both the tip and ring conductors of a transmission line by utilizing a plurality of discrete semiconductor devices. Six of these semiconductor devices are diodes which function as rectifiers to permit the passage of current in only one direction. These diodes are referred to as "steering" diodes for that reason. Another of the plurality of discrete semiconductor devices is a gated Silicon Controlled Rectifier (SCR) controlled by a voltage and/or current sensing circuit.

The Dickey device is complex and includes a nonconductive housing with several mechanical parts. Openings are formed in the housing to receive the discrete semiconductors and the metallic plates associated with the discrete semiconductors. These metallic plates act as electrical connectors and heat dissipaters. The device disclosed in Dickey relies upon external metal springs to hold together the semiconductors upon a failure. The discrete semiconductors and the metallic plates must be mounted manually into the housing, one at a time, which adds greatly to the assembly time and overall cost of the protection device, especially when the metal springs are included as described above.

Copending Application Ser. No. 07/917,778 filed Jul. 21, 1992 in the name of Muni Mitchell, Robert Fried, Lou Schilling, and Willem Einthoven, and entitled "Surge Protector Circuit Module and Method for Fabricating Same" (owned by the assignee hereof) teaches a unitary circuit module adapted to be installed as a single unit in a telecommunications protection device. This unitary circuit module overcomes the problems associated with the Dickey type device. It employs a unique lead frame permitting a plurality of unitary circuit modules to be fabricated using mass production techniques. As a result, the cost of each individual module itself is reduced, as is the cost of the construction and assembly of the telecommunication protection device.

In the invention described in the above noted Mitchell, et al. application, a plurality of surge protection circuit modules are simultaneously formed around spaced portions of an extended lead frame, wherein each module has a set of six steering diodes and an ungated thyristor. The extended lead frame includes three spaced parallel leads for each module. These parallel leads have ends which extend out of each of the housings, and all of these ends of all modules are connected by a bridge. During assembly, each set of diodes and their corresponding thyristor is arranged along the extended lead frame in a fixture. By heating, each lead of each module is soldered between a corresponding pair of diodes, and the diodes on each side of the lead frame are soldered to one of two metallic conductor plates. The thyristor of each module is soldered between the two metallic conductor plates. A plurality of semiconductor subassemblies, wherein each semiconductor subassembly has six diodes, a thyristor, three leads, and two metallic conductor plates, are thus formed.

The semiconductor subassemblies thus formed are removed as a unit from the fixture. The semiconductor subassemblies may be encased simultaneously. The bridge is then removed to separate the modules, and the leads are trimmed and bent as required.

Semiconductor subassemblies of this type are commonly sealed in a nonconductive material, such as epoxy. The epoxy is melted and allowed to cure around the semiconductor subassembly prior to the removal of the bridge. It was also contemplated that the semiconductor subassemblies could be separated before encapsulation.

One application for a surge protector of this type is to protect telephone equipment and users thereof from transient high currents which may be present on telecommunication lines due to lightning strikes. The surge protector reacts to a high current surge by switching to a closed state to thereby connect the telecommunication line carrying the surge to ground. It is, therefore, essential that the surge protector not fail in an open state, leaving the equipment and the users thereof unprotected.

In the event of a high current surge, a surge protector can rapidly heat to a high temperature (e.g., 300°). At such a temperature, a molded epoxy case may start to crack. If cracks begin to form in the epoxy, the cracks tend to propagate through the epoxy. As these cracks propagate through the epoxy, the epoxy can chip, even to such an extent that some chips are brutally ejected from the epoxy. If chipping is severe enough, the components of the semiconductor subassembly, namely the diodes, the thyristor, the leads, and the conductor plates, can physically separate. The separation of the semiconductor subassembly components results in a failure of the surge protector in an open state, leaving the telecommunications equipment and the users unprotected.

High temperatures may also cause the components of the semiconductor subassembly themselves to fracture. Fracture of the components of the semiconductor subassembly may also result in an open circuit condition.

SUMMARY OF THE INVENTION

It is, therefore, an object of the present invention to provide a two part snap together thermoplastic case for a semiconductor subassembly of a surge protector.

It is another object of the present invention to provide a case for a semiconductor subassembly of a surge protector which includes a mechanism which substantially reduces the possibility of the surge protector failing in an open condition in response to a high energy surge.

It is another object of the present invention to provide a case for a semiconductor subassembly of a surge protector which includes spring tabs to retain components of the semiconductor subassembly together.

It is another object of the present invention to provide a simplified method for encapsulating semiconductor subassemblies of surge protectors.

In accordance with one aspect of the present invention, a module includes a semiconductor subassembly having a plurality of semiconductor components. A hollow case includes first and second case parts, wherein the first and second case parts encapsulate the semiconductor subassembly. A force applying means applies force on the semiconductor subassembly to retain the semiconductor components thereof together. The force applying means is integral with the hollow case.

Preferably, the force applying means may comprise a first spring tab integral with the first case part and a second spring tab integral with the second case part. The first and second spring tabs may be aligned, and each case part may include a window containing a corresponding spring tab.

The semiconductor components may be situated between conductor plates. The force applying means may align with the semiconductor components, and may be apply force on the conductor plates.

Joining means may be provided for joining the first and second case parts in a snap together, friction fit.

In accordance with another aspect of the present invention, a semiconductor subassembly includes semiconductor components arranged to provide protection against high energy surges. A case includes first and second thermoplastic case parts. The first and second thermoplastic case parts are substantially identical. Each of the first and second thermoplastic cast parts has a recess formed therein, such that the recesses in the first and second thermoplastic case parts are aligned to form a cavity for receiving the semiconductor subassembly therein. A joining means joins the first and second thermoplastic case parts together.

Preferably, a deformable spring means is provided in the case for applying force on the semiconductor subassembly to retain the semiconductor components of the semiconductor subassembly together.

A deformable spring means may apply force on the semiconductor subassembly to retain the semiconductor components together. The deformable spring means may include a first spring tab integral with the first thermoplastic case part and a second spring tab integral with the second thermoplastic case part. The first and second spring tabs may be aligned with one another.

The joining means may comprise a protrusion and a recess for each of the first and second thermoplastic case parts wherein the protrusions of the first and second thermoplastic case parts protrude into corresponding recesses of the first and second thermoplastic case parts when the first and second thermoplastic case parts are joined.

Each of the first and second thermoplastic case parts may have a window. The window of the first thermoplastic case part may contain the first spring tab, and the window of the second thermoplastic case part may contain the second spring tab.

The semiconductor subassembly may include first, second, third, fourth, fifth, and sixth diodes, a thyristor, first and second conductor plates, and first, second, and third leads. The first lead is electrically connected between a first side of the first and second diodes. The second lead is electrically connected between a first side of the third and fourth diodes. The third lead is electrically connected between a first side of the fifth and sixth diodes. The first conductor plate is electrically connected to a second side of the first, third, and fifth diodes. The second conductor plate is electrically connected to a second side of the second, fourth, and sixth diodes. The thyristor is electrically connected between the first and second conductor plates. The first, second, third, fourth, fifth, and sixth diodes are oriented so that the first conductor plate has a polarity which is positive with respect to a polarity of the second conductor plate. The first lead acts as a first alternating current terminal. The second lead acts as a second alternating current terminal. The third lead acts as a third alternating current terminal.

The deformable spring means comprises first, second, third, and fourth spring tabs integral with the first thermoplastic case part, and fifth, sixth, seventh, and eighth spring tabs integral with the second thermoplastic case part. The first and fifth spring tabs are aligned with the first and second diodes, and are arranged to apply a force on the first and second conductor plates. The second and sixth spring tabs are aligned with the third and fourth diodes, and are arranged to apply a force on the first and second conductor plates. The third and seventh spring tabs are aligned with the fifth and sixth diodes, and are arranged to apply a force on the first and second conductor plates. The fourth and eighth spring tabs are aligned with the thyristor, and are arranged to apply a force on the first and second conductor plates.

The joining means may comprise a protrusion and a recess for each of the first and second thermoplastic case parts wherein the protrusions of the first and second thermoplastic case parts protrude into corresponding recesses of the first and second thermoplastic case parts when the first and second thermoplastic case parts are joined.

In accordance with another aspect of the present invention, a method is provided for encapsulating circuit semiconductor subassemblies in corresponding hollow cases. Each of the hollow cases includes snap together first and second thermoplastic case parts. The first and second thermoplastic case parts each have a semiconductor subassembly receiving recess and deformable spring means for applying a force on the semiconductor subassembly encapsulated by the corresponding hollow case. The method comprises the steps of (a) positioning a plurality of first thermoplastic case parts so that the semiconductor subassembly receiving recess of each such first thermoplastic case part is exposed, (b) placing a semiconductor subassembly in the exposed semiconductor subassembly receiving recess in each of the first thermoplastic case parts, (c) placing a second thermoplastic case part over each first thermoplastic case part with the semiconductor subassembly receiving recess of each second thermoplastic case part aligned with the semiconductor subassembly in the corresponding first thermoplastic case part, and (d) applying a relatively low pressure to the first and second thermoplastic case parts to deform the deformable spring means and to snap the corresponding first and second thermoplastic case parts together.

The semiconductor subassembly encapsulated in each hollow case may comprise a plurality of semiconductor components sandwiched between conductor plates. The deformable spring means may apply a force on the conductor plates to retain the semiconductor components of the semiconductor subassembly together.

BRIEF DESCRIPTION OF THE DRAWING

These and other features and advantages will become more apparent from a detailed consideration of the invention when taken in conjunction with the drawing in which like numerals refer to like parts, and in which:

FIG. 2 is an exploded isometric view showing the semiconductor subassembly and case of the module of FIG. 1;

FIG. 4 is a cross-sectional view of the module taken along line 4—4 of FIG. 1;

DETAILED DESCRIPTION OF THE PREFERRED EMBODIMENT

The case of the present invention is particularly well suited for use with a semiconductor subassembly to form a module for a surge protector. For that reason, the invention is described in that context. However, it should be appreciated that the invention may be applicable to a wide range of different types of semiconductor subassemblies, and should not be considered restricted to semiconductor subassemblies designed for use in surge protectors only.

Figure 1:
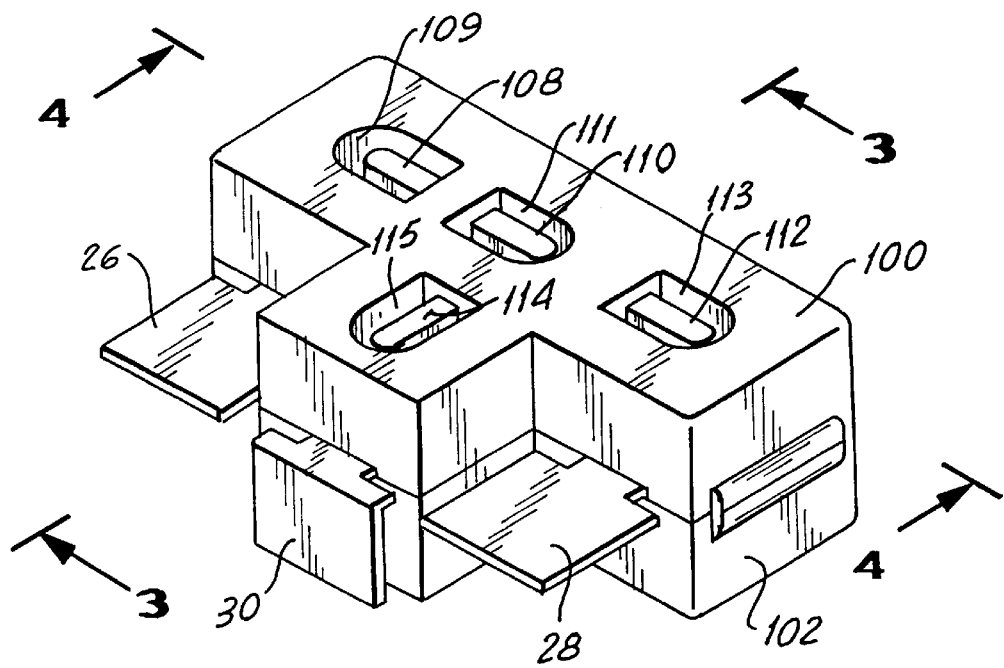
FIG. 1 is an isometric view of a module wherein a semiconductor subassembly is encapsulated in the case of the present invention.
Figure 3:
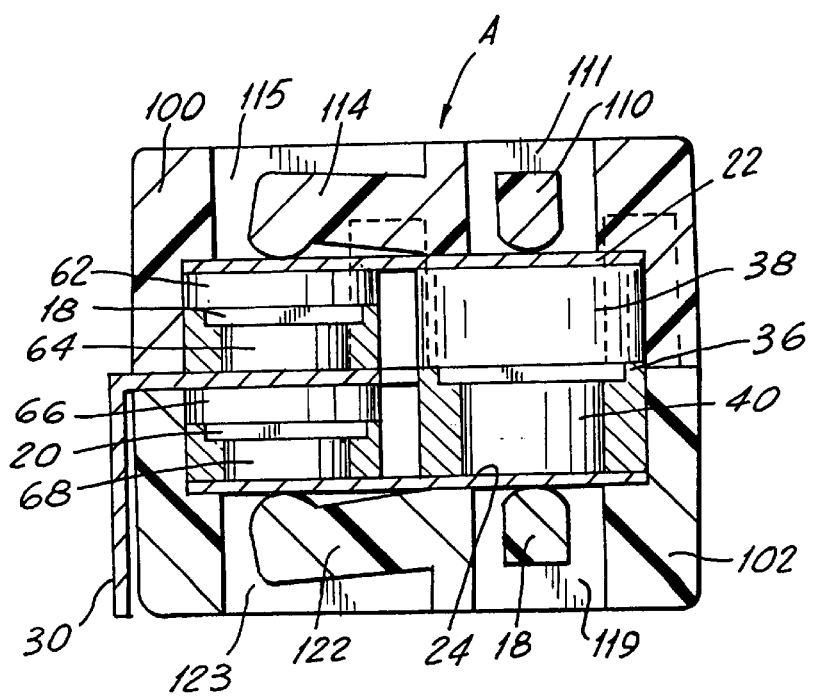
FIG. 3 is a cross-sectional view of the module taken along line 3—3 of FIG. 1.
Figure 5:
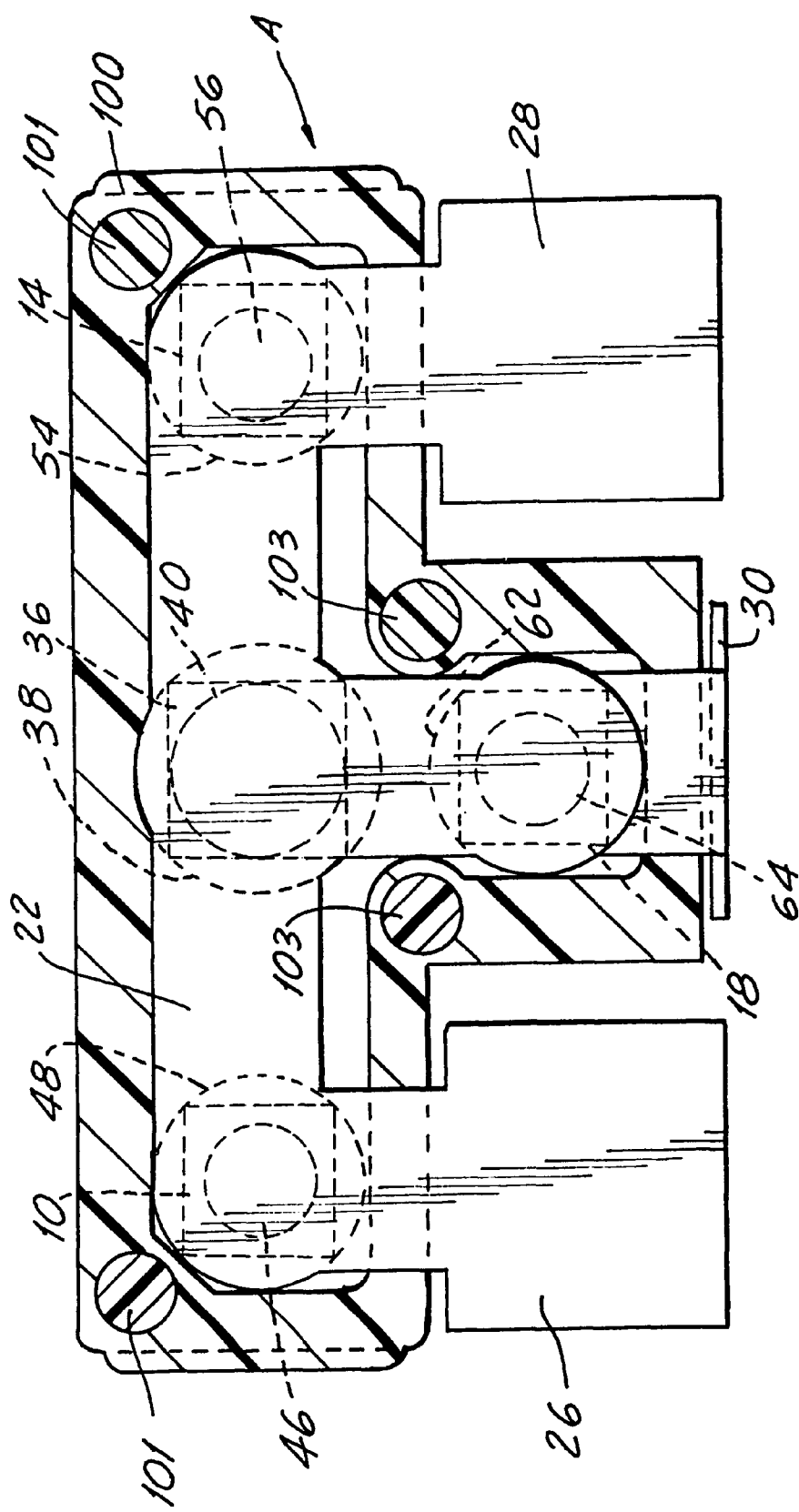
FIG. 5 is a cross-sectional view of the module taken along line 5—5 of FIG. 4; and, FIG. 6 is a cross-sectional view of the module taken along line 6—6 of FIG. 4.
Figure 6:
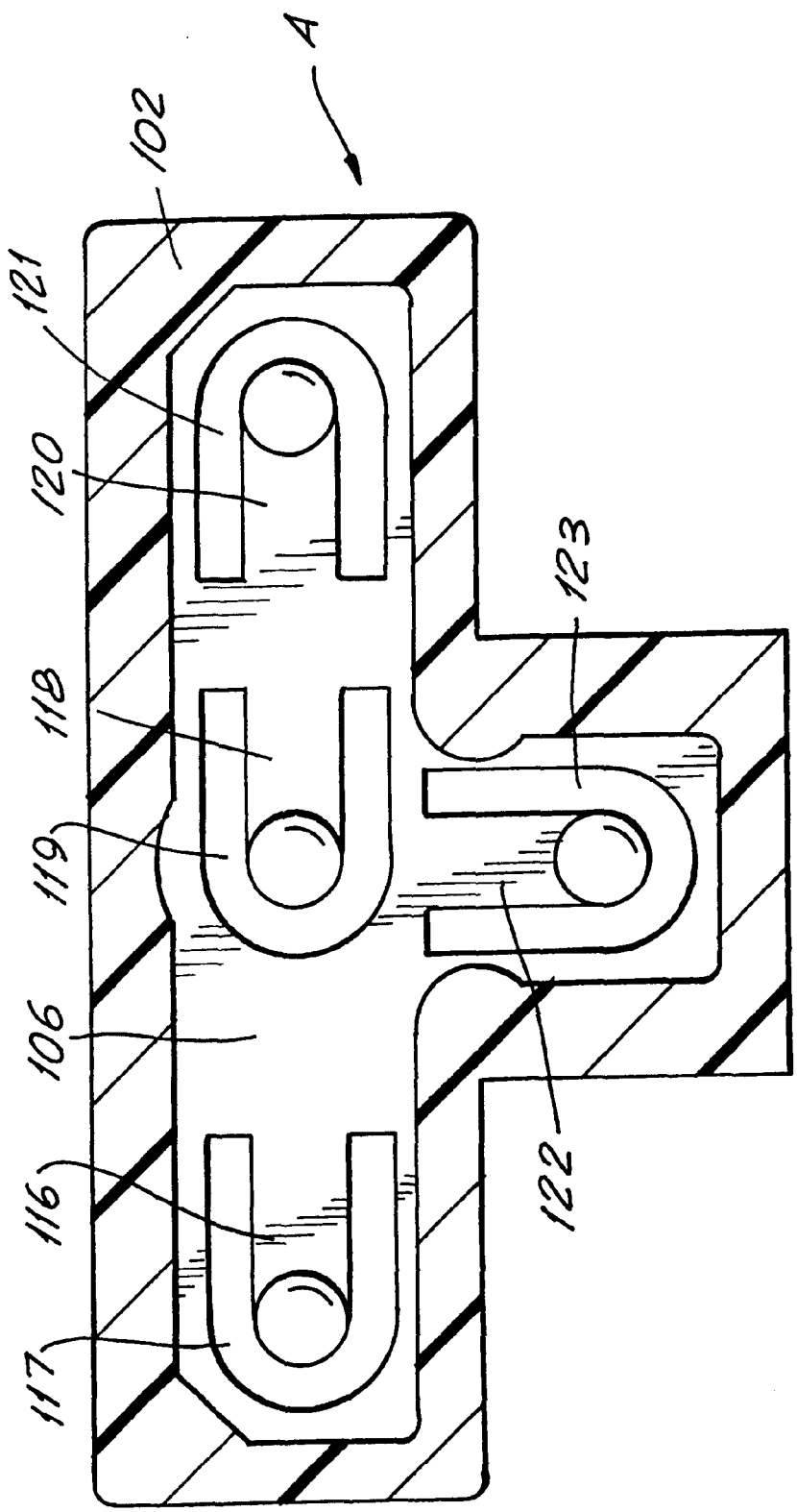

As seen in the drawing, and particularly in FIGS. 3, 4 and 5, a surge protector includes six semi-conductor diodes 10, 12, 14, 16, 18, and 20 which function as rectifiers to direct the flow of current in a single direction ("steering" diodes). The diodes 10–20 are connected to form a bridge rectifier. The cathodes of the diodes 10, 14, and 18 are electrically connected together by a conductor plate 22, which acts as a positive direct current terminal. The anodes of the diodes 12, 16, and 20 are electrically connected together by a conductor plate 24, which acts as a negative direct current terminal.

The anode of the diode 10 and the cathode of the diode 12 are electrically connected to opposite sides of a lead 26, which acts as a first alternating current terminal. The anode of the diode 14 and the cathode of the diode 16 are electrically connected to opposite sides of a lead 28, which acts as a second alternating current terminal. The anode of the diode 18 and the cathode of the diode 20 are electrically connected to opposite sides of a lead 30, which acts as a third alternating current terminal. This arrangement results in a circuit in which, regardless of the polarity of any potential applied to the leads 26, 28, and 30, the polarity of the conductor plate 22 will remain positive with respect to the polarity of the conductor plate 24.

The lead 26, for example, may be connected to the tip conductor of a telecommunication line, the lead 28 may be connected to the ring conductor of the telecommunication line, and the lead 30 may be connected to ground.

An ungated thyristor 36 is provided. The anode of the thyristor 36 is electrically connected to the conductor plate 22 by way of a conductive spacer 38, and the cathode of the thyristor 36 is electrically connected to the conductor plate 24 by way of a conductive spacer 40.

To form a semiconductor subassembly, the conductor plates 22 and 24 are situated in spaced, generally parallel relation, at the top and bottom of each location along a fixture. The cathodes of a first set of three diodes 10, 14, and 18 are situated in spaced relation along one side of the conductor plate 22. The anodes of a second set of three diodes 12, 16, and 20 are situated in the same spaced relation along one side of the conductor plate 24. Three pairs of aligned diodes are thus formed; 10 and 12, 14 and 16, and 18 and 20.

A lead frame section, fabricated of metal such as by stamping, forms the base of each circuit. The frame section includes the three spaced parallel leads 26, 28, and 30. The leads may be connected at one end by a bridge (not shown). Each lead of the frame section is situated between the diodes of a corresponding diode pair. In particular, the anode of each of the diodes 10, 14 and 18 is situated adjacent to one side of a corresponding one of the leads 26, 28, and 30, respectively. The cathode of each of the diodes 12, 16, and 20 is situated adjacent to the other side of a corresponding one of the leads 26, 28, and 30, respectively.

The conductive spacers 38 and 40, preferably made of copper, may be provided with solder preforms on both sides. These solder preforms permit the conductive spacers 38 and 40 to be soldered between the surfaces of the thyristor 36 and the corresponding conductor plates 22 and 24, respectively.

Conductive spacers 46 and 48 are associated with the diode 10. Conductive spacers 50 and 52 are associated with the diode 12. Conductive spacers 54 and 56 are associated with the diode 14. Conductive spacers 58 and 60 are associated with the diode 16. Conductive spacers 62 and 64 are associated with the diode 18. Conductive spacers 66 and 68 are associated with the diode 20.

Solder preforms may be provided between the diodes 10, 14, and 18, their associated conductive spacers 46, 48, 54, 56, 62, and 64, the leads 26, 28, and 30, and the conductor plate 22. Similarly, solder preforms may be provided between the diodes 12, 16, and 20, their associated conductive spacers 50, 52, 58, 60, 66, and 68, the leads 26, 28, and 30, and the conductor plate 24. These solder preforms permit the diode 10 and its conductive spacers 46 and 48 to be soldered between the lead 26 and the conductor plate 22, permit the diode 12 and its conductive spacers 50 and 52 to be soldered between the lead 26 and the conductor plate 24, permit the diode 14 and its conductive spacers 54 and 56 to be soldered between the lead 28 and the conductor plate 22, permit the diode 16 and its conductive spacers 58 and 60 to be soldered between the lead 28 and the conductor plate 24, permit the diode 18 and its conductive spacers 62 and 64 to be soldered between the lead 30 and the conductor plate 22, and permit the diode 20 and its conductive spacers 66 and 68 to be soldered between the lead 30 and the conductor plate 24.

A lead frame section is situated between each set of components, and the sub-assemblies are then heated to melt the solder. After the solder hardens, the semiconductor subassemblies are encapsulated. The leads 26, 28, and 30 extend out the module. The leads may be trimmed, and the lead 30 may be bent as shown.

As best seen in FIG. 2, the case for the semiconductor subassembly, generally designed A, includes hollow, substantially identical first and second thermoplastic case parts 100 and 102. For example, the first and second thermoplastic case parts 100 and 102 may be injected molded using Vectra C130 thermoplastic supplied by Hoechst Celanese Corp. This material includes about 30% glass and a copolymer resin such as liquid crystal. This material is described, for example, in U.S. Pat. No. 4,719,250 and possibly in U.S. Pat. No. 5,227,456.

The first and second thermoplastic case parts 100 and 102 each include two generally cylindrical protrusions 101 and 103, and two generally cylindrical recesses 105 and 107 which are adapted to align and permit the first and second thermoplastic case parts 100 and 102 to frictionally engage (snap together) to enclose a corresponding semiconductor subassembly therebetween.

Each of the first and second thermoplastic case parts 100 and 102 has a corresponding semiconductor subassembly receiving recess 104 and 106 shaped to receive half of the semiconductor subassembly. When the first and second thermoplastic case parts 100 and 102 are aligned and snapped together, the semiconductor subassembly receiving recesses 104 and 106 cooperate to form a semiconductor subassembly receiving cavity into which a semiconductor subassembly in situated.

The first thermoplastic case part 100 is provided with four integral spring tabs or fingers 108, 110, 112, and 114, respectively extending from the rim of, and situated in alignment with, windows or openings 109, 111, 113, and 115 therein. Similarly, the second thermoplastic case part 102 is provided with four integral spring tabs 116, 118, 120, and 122, respectively extending from the rim of, and aligned with, windows 117, 119, 121, and 123 therein. Each spring tab is provided with a rounded or arcuate surface proximate its end. Thus, when the first and second thermoplastic case parts 100 and 102 are snapped together, the integral spring tabs 108 and 116 align with the diodes 10 and 12, the integral spring tabs 110 and 118 align with the thyristor 36, the integral spring tabs 112 and 120 align with the diodes 14 and 16, and the integral spring tabs 114 and 122 align with the diodes 18 and 20. Thus, separate pairs of spring tabs are situated in alignment with each diode pair, and one pair of integral spring tabs is situated in alignment with the thyristor 36.

Snapping the first and second thermoplastic case parts 100 and 102 together causes the spring tabs to deform. Because of the resilient character of the thermoplastic material, the deformed spring tabs bear on the conductor plates 22 and 24, applying force on the conductor plates tending to urge the conductor plates towards each other so as to maintain the semiconductor subassembly therebetween under pressure.

As compared to molding thermosetting epoxy material for encapsulation of the semiconductor subassemblies, the use of premolded injected thermoplastic snap together case parts has a number of advantages. The molding of thermosetting epoxy around the semiconductor subassembly of a surge protector must be done by the manufacturer of the surge protector, whereas premolded thermoplastic snap together case parts may be premolded by either the surge protector manufacturer or by a parts supplier. Therefore, the case of the present invention may be kept in stock for immediate use, or may be provided by the parts supplier at the time that the case is required, thereby reducing the parts inventory of the surge protector manufacturer. The number of steps necessary for the encapsulation operation by the use of premolded injected thermoplastic snap together case parts are fewer, and the encapsulation process is simpler. The yield is better because the possibility of damage in the press is reduced, and the problems associated with partial molding are eliminated.

The time for molding thermoplastic cases, as compared to molding epoxy, is greatly reduced. The molds used for molding thermoplastic case parts do not have to be pre-heated. Therefore, the time required to preheat, or cure, epoxy is eliminated.

The packaging process for packaging semiconductor subassemblies begins with loading a plurality of hollow first thermoplastic case parts, open side up, onto a tray or magazine. The semiconductor subassemblies are then placed into the semiconductor subassembly receiving recesses in the hollow first thermoplastic case parts. A hollow second thermoplastic case part is placed over each hollow first thermoplastic case part, with the semiconductor subassembly receiving recess of each hollow second thermoplastic case part aligned with the semiconductor subassembly receiving recess in a corresponding hollow first thermoplastic case part.

A low pressure is applied to the aligned first and second thermoplastic case parts to deform the spring tabs of the thermoplastic case parts and to snap the thermoplastic case parts together by causing the protrusions to seat in the corresponding protrusion receiving recesses. Each of the deformed spring tabs applies a force on the conductor plates, tending to urge the conductor plates together.

The leads are trimmed and bent, if required. The modules are then ready for immediate testing.

No pre-heating of the mold, of the semiconductor subassembly, or of epoxy is required. Epoxy does not have to be cured. No sandblasting or deflashing is necessary. Thus, the packaging process of the present invention can be automated much more easily.

With respect to surge protection specifically, the use of thermoplastic case parts according to the present invention eliminates the cracks often associated with molded epoxy cases when subjected to high temperature due to a high current surge. These cracks tend to propagate through an epoxy case. As a result of such cracks, an epoxy case may chip, sometimes with brutal ejection of some of the chips. The components of a semiconductor subassembly housed by such an epoxy case may then separate if the solder of the semiconductor subassembly melts, causing the device to fail in an open condition.

On the other hand, the thermoplastic case of the present invention deforms and melts in the presence of a sufficiently high temperature due to a high current surge so that the thermoplastic case does not chip. During deformation and melting, the case holds the semiconductor subassembly components together, even after the solder joining the semiconductor components melts. Even after melting, the thermoplastic case literally sticks around the semiconductor subassembly like an adhesive. The spring tabs act as a fail safe mechanism to hold the semiconductor subassembly components together, even if the components of the semiconductor subassembly fracture, thus maintaining the voltage limiting capability of the device during high current surges.

However, the presence of the spring tabs does not add significantly to the cost of the case itself. The integral spring tabs are integral with the case and hence are formed when the case is formed. The packaging process requires no additional operations due to the presence of the spring tabs.

It will now be appreciated that the present invention relates to a thermoplastic two part snap together case for a semiconductor subassembly which permits a simplified packaging procedure. When used to package semiconductor surge protector subassemblies, the cracking normally associated with an epoxy case is eliminated. The thermoplastic case tends to hold the components together under surge conditions. This function is further enhanced by the deformable spring tabs of the thermoplastic case.

While only a single preferred embodiment of the present invention has been disclosed for purposes of illustration, many variations and modifications can be made thereto. For example, in the fabrication of surge protection modules incorporating the present invention, individual leads can be employed instead of a lead frame, if desired, thereby eliminating the necessity for trimming of the bridge which connects the leads. All of these and other variations and modifications are within the scope of the present invention.

We claim:

1. A module comprising:
   a semiconductor subassembly including a plurality of semiconductor components;
   a hollow case including first and second case first and second case parts, encapsulate the semiconductor subassembly; and,
   force applying means for applying force on the semiconductor assembly to retain the semiconductor components thereof together, wherein the force applying means and at least one of the first and second case parts are of unitary constructions, and
   wherein the force applying means comprises a first spring tab, and wherein the first spring tab and the first case part are of unitary construction.

2. The module of claim 1 wherein the force applying means comprises a second spring tab, and wherein the second spring tab and the second case part are of unitary construction.

3. The module of claim 2 wherein the first and second spring tabs are aligned with one another.

4. The module of claim 1 wherein the first case part comprises a window, and wherein the first spring tab is aligned with the window.

5. A module comprising:
   a semiconductor subassembly including a plurality of semiconductor components;
   a hollow case including first and second case parts, wherein the first and second case parts encapsulate the semiconductor subassembly; and,
   force applying means for applying force on the semiconductor assembly to retain the semiconductor components thereof together, wherein the force applying means and at least one of the first and Second case parts are of unitary construction, and
   wherein the semiconductor subassembly further includes conductor plates, and wherein the semiconductor components are situated between the conductor plates, and
   wherein the force applying means is aligned with the semiconductor components and applies a force on the conductor plates.

6. A module comprising:
   a semiconductor subassembly including a plurality of semiconductor components;
   a hollow case including first and second case parts, wherein the first and second case parts encapsulate the semiconductor subassembly; and
   force applying means for applying force on the semiconductor assembly to retain the semiconductor components thereof together, wherein the force applying means and at least one of the first and second case parts are of unitary construction and
   wherein the first and second case parts comprise corresponding first and second thermoplastic case parts, wherein the first and second thermoplastic case parts are substantially identical, wherein each of the first and second thermoplastic case parts has a corresponding recess formed therein, wherein the recesses in the first and second thermoplastic case parts align to form a cavity for receiving the semiconductor assembly therein, and wherein the hollow case further comprises joining means for joining the first and second thermoplastic case parts together.

7. The module of claim 6 wherein the force applying means comprises first and second spring tabs, wherein the first spring tab and the first thermoplastic case part are of unitary construction, and wherein the second spring tab and the second thermoplastic case part are of unitary construction.

8. The module of claim 7 wherein the first and second spring tabs are aligned with one another.

9. The module of claim 8 wherein the joining means comprises a protrusion and a hole for each of the first and second thermoplastic case parts, and wherein the protrusions of the first and second thermoplastic case parts protrude into the corresponding holes of the first and second thermoplastic case parts when the first and second thermoplastic case parts are joined.

10. The module of claim 9 wherein each of the first and second thermoplastic case parts has a window, wherein the window of the first thermoplastic case part contains the first spring tab, and wherein the window of the second thermoplastic case part contains the second spring tab.

11. The module of claim 6 wherein the semiconductor subassembly includes first, second, third, fourth, fifth, and sixth diodes, a thyristor, first and second conductor plates, and first, second, and third leads, wherein the first lead is electrically connected between a first side of the first and second diodes, wherein the second lead is electrically connected between a first side of the third and fourth diodes, wherein the third lead is electrically connected between a first side of the fifth and sixth diodes, wherein the first conductor plate is electrically connected to a second side of the first, third, and fifth diodes, wherein the second connector plate is electrically connected to a second side of the second, fourth, and sixth diodes, wherein the thyristor is electrically connected between the first and second connector plates, wherein the first, second, third, fourth, fifth, and sixth diodes are oriented so that the first conductor plate has a polarity which is positive with respect to a polarity of the second connector plate, wherein the first lead acts as a first alternating current terminal, wherein the second lead acts as a second alternating current terminal, and wherein the third lead acts as a third alternating current terminal.

12. The module of claim 11 wherein the force applying means comprises first, second, third, fourth, fifth, sixth, seventh, and eighth spring tabs, wherein the first, second, third, and fourth spring tabs and the first thermoplastic case part are of unitary construction, wherein the fifth, sixth, seventh, and eighth spring tabs and the second thermoplastic case part are of unitary construction, wherein the first and fifth spring tabs are aligned with the first and second diodes and are arranged to apply a force on the first and second conductor plates, wherein the second and sixth spring tabs are aligned with third and fourth diodes and are arranged to apply a force on the first and second connector plates, wherein the third and seventh spring tabs are aligned with the fifth and sixth diodes and are arranged to apply a force on the first and second connector plates, and wherein the fourth and eighth spring tabs are aligned with the thyristor and are arranged to apply a force on the first and second conductor plates.

13. The module of claim 12 wherein the joining means comprises a protrusion and a hole for each of the first and second thermoplastic case parts, and wherein the protrusions of the first and second thermoplastic case parts protrude into the corresponding holes of the first and second thermoplastic case parts when the first and second thermoplastic case parts are joined.

* * * * *

UNITED STATES PATENT AND TRADEMARK OFFICE
CERTIFICATE OF CORRECTION

PATENT NO.    : 6,239,987 B1
DATED         : May 29, 2001
INVENTOR(S)   : Richard Sheng-Tong Shyr et al.

It is certified that error appears in the above-identified patent and that said Letters Patent is hereby corrected as shown below:

Column 9,
Ling 10, after "case" (2nd occurrence), delete -- first and second case --.
Line 11, after "parts,", insert -- wherein the first and second case parts --.
Line 17, after "unitary", change "constructions" to -- construction --.
Line 39, after "and" (2nd occurrence), change "Second" to -- second --.

Signed and Sealed this

Thirtieth Day of July, 2002

Attest:

JAMES E. ROGAN
Attesting Officer    Director of the United States Patent and Trademark Office